United States Patent [19]

Nakamura et al.

[11] Patent Number: 4,943,777
[45] Date of Patent: Jul. 24, 1990

[54] BATTERY VOLTAGE WARNING DEVICE

[75] Inventors: Kazuhiro Nakamura; Tatsuya Yoshioka, both of Hamamatsu; Ryoji Sawada, Iwata; Tomoji Nakamura, Iwata, all of Japan

[73] Assignee: Sanshin Kogyo Kabushiki Kaisha, Hamamatsu, Japan

[21] Appl. No.: 445,895

[22] Filed: Dec. 2, 1989

Related U.S. Application Data

[63] Continuation of Ser. No. 262,528, Oct. 25, 1988, abandoned.

[30] Foreign Application Priority Data

Oct. 26, 1987 [JP] Japan .................................. 62-259841

[51] Int. Cl.⁵ .......................................... G01N 27/46
[52] U.S. Cl. ...................... 324/433; 320/48; 324/429; 340/636
[58] Field of Search ............... 324/426, 427, 429, 433, 324/435, 434; 340/636, 455, 657, 660, 661, 662, 663, 664; 320/48

[56] References Cited

U.S. PATENT DOCUMENTS

| | | | |
|---|---|---|---|
| 3,673,588 | 6/1972 | Riff | 340/455 |
| 4,193,025 | 3/1980 | Frailing et al. | 324/427 |
| 4,290,109 | 9/1981 | Taniguchi et al. | 324/433 X |
| 4,361,809 | 11/1982 | Bil et al. | 324/426 |
| 4,423,378 | 12/1983 | Marino et al. | 324/433 X |
| 4,659,994 | 4/1987 | Poljak | 324/434 X |
| 4,803,459 | 2/1989 | Ta | 324/433 X |

Primary Examiner—Reinhard J. Eisenzopf
Assistant Examiner—Robert W. Mueller
Attorney, Agent, or Firm—Ernest A. Beutler

[57] ABSTRACT

A battery voltage condition indicator in which the battery voltage is periodically sampled and a warning indication is given if the battery voltage falls below a predetermined relatively high value for relatively short periods of time or a predetermined higher voltage value for longer periods of times. In addition, a warning signal is also given in the event an open circuit occurs.

6 Claims, 3 Drawing Sheets

BATTERY VOLTAGE WARNING DEVICE

This is a continuation of U.S. patent application Ser. No. 262,528, filed Oct. 25, 1988, now abandoned.

BACKGROUND OF THE INVENTION

This invention relates to a battery voltage warning device and more particularly to an improved and simplified arrangement for testing the condition of a battery and providing an indication when the battery charge has depleted.

A variety of indicator devices have been proposed for indicating battery condition. For example, devices have been proposed that indicate the level of electrolyte in the storage battery, the specific gravity of the electrolyte to indicate its state of charge, and charging ammeters or voltmeters to indicate the condition of the battery. However, the use of such sensors or battery condition indicators can give rise to certain difficulties, particularly where the battery is not a fixed portion of the vehicle in which the indicating system is provided. Although these types of warning indicators may have good application for automotive use, wherein the battery is kept in place for long periods of time, it is difficult to use such arrangements in marine batteries. This is because the batteries are frequently installed by users or dealers and exchanged according to the type of vessel and engine employed.

Therefore, it is a principal object of this invention to provide an improved battery condition indicator that can be utilized in a wide variety of applications.

It is a further object of this invention to provide a battery condition indicator that can be incorporated in the electrical circuit of a vehicle and which need not be separately mounted to the battery to determine its condition.

It is a further object of this invention to provide an improved and simplified battery condition indicator.

SUMMARY OF THE INVENTION

This invention is adapted to be embodied in a system for determining the condition of a battery that is in circuit with an internal combustion engine that has a starter motor operated by the battery and generating means driven by the engine for maintaining a charge in the battery. First means are provided for reading the voltage at first relatively short selected time periods and second means are provided for reading the voltage at relatively longer time periods. Warning means are provided for providing a battery condition warning the event either the first sensing means senses a voltage below a first value during several sampling cycles or in the event the second means senses a voltage below a second value which is higher than the first value during successive longer sampling cycles.

DETAILED DESCRIPTION OF THE PREFERRED EMBODIMENT OF THE INVENTION

Figure 1:
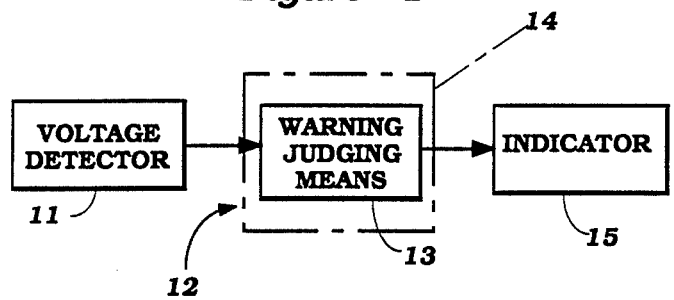
FIG. 1 is a schematic block diagram showing a battery condition indicator constructed in accordance with an embodiment of the invention.

Reffering first to FIG. 1, the battery voltage condition indicator is shown schematically in block form and is comprised of a voltage detector 11 that successively reads the voltage output of the battery during predetermined time intervals, such as every two hundred milliseconds. The output from the voltage detector 11 is transmitted to a battery voltage warning device, indicated generally by the reference numeral 12 which includes a warning judging circuit 13 which forms a part of a microcomputer 14. If the battery voltage as detected by the detector 11 falls outside of certain ranges, indicated hereinafter, the warning judging means will send a warning signal to operate an indicator 15 so as to provide either a visual and/or an audial warning indication to the operator.

Figure 2:
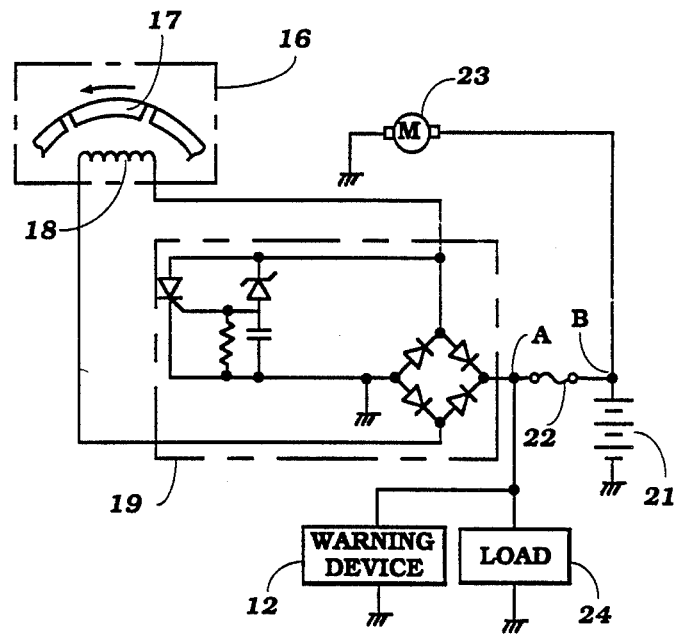
FIG. 2 is a schematic diagram showing the association of a battery with a spark ignited internal combustion engine having a battery condition indicator constructed in accordance with an embodiment of the invention.

FIG. 2 shows specifically how the invention can be employed in conjunction with an internal combustion engine of the spark ignited type which forms a portion of a marine propulsion unit. Although the invention is described in conjunction with a spark ignited engine, it is to be understood that the invention can be utilized in conjunction with diesel or other type engines.

Referring now primarily to FIG. 2, the device as applied to the electrical system for an internal combustion engine (not shown) is depicted. The engine includes a magneto generator 16 having a flywheel that is comprised of a plurality of permanent magnets 17 that cooperate with a charging coil 18 for generating an electromagnetic force upon rotation of the flywheel of the magneto generator 16. This electrical current is transmitted to a charging circuit 19 including a diode bridge so as to charge a storage battery 21. A protective fuse 22 is located between a pair of junctions A and B for protection purposes.

The battery 21 is utilized to power a starting motor 23 that is selectively controlled by the operator for starting the associated engine. In addition, various other electrical loads 24 are supplied with power from the battery 21. Such other loads may consist of lighting systems, power tilt and trim units or the like.

It will be noted that the warning device 12 is in the circuit from the battery 21 and thus senses the condition of the voltage of the battery under any of a wide variety of conditions.

The warning device 12 is particularly adapted to provide a warning signal either when the long term voltage of the battery falls below a predetermined minimum voltage $V_3$ for a long period of time, such as a minute or longer. In addition, the warning device 12 provides a warning signal in the event that repeated operation of the starter motor causes the voltage of the battery 21 to fall below a voltage $V_2$ which is sufficient to operate the starting motor 23 once the starter gear associated with it is engaged and when this voltage falls below that value $V_2$ for a predetermined period of time such as three seconds. The value $V_2$ is lower than the value $V_3$.

In addition, the warning device 12 will provide an output signal in the event the voltage of the battery exceeds a predetermined high voltage $V_1$ such as would occur in the event the load is suddenly removed from the battery due to disconnection of the battery cables or a like condition.

Figure 3:
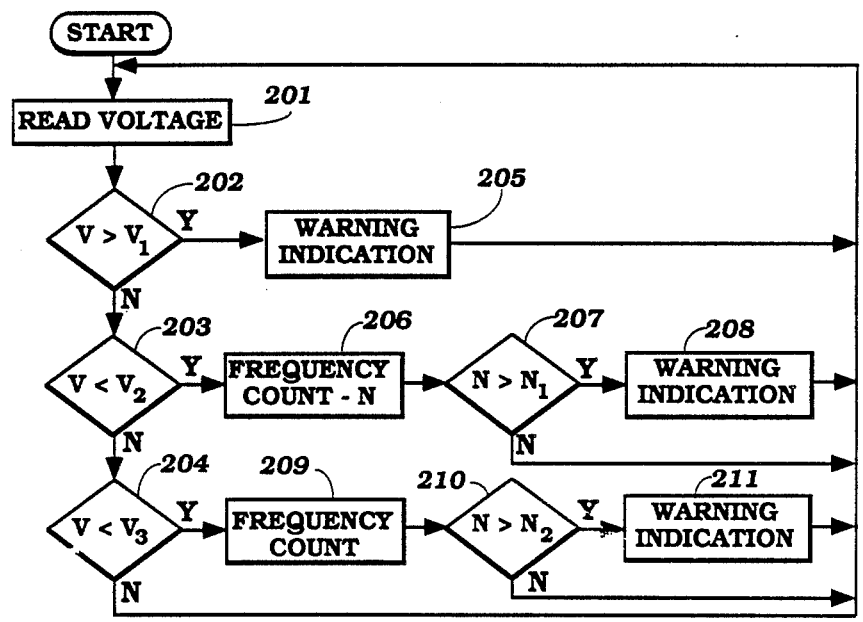
FIG. 3 is a block diagram showing the routine by which the battery condition indicator operates.
Figure 4:
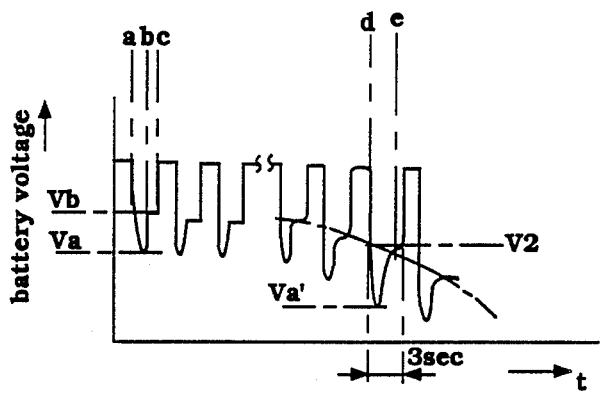
FIG. 4 is a curve showing the battery voltage as it is effected during successive starting operations.

The operation may be best understood by reference to FIGS. 3 and 4. FIG. 4 shows the battery voltage as it exhibits during successive starting cycles. As when the operator initiates the starter motor at the point a, the voltage will drop to a voltage $V_a$ which is the voltage necessary to cause the starter motor to begin to rotate. As the starter begins to rotate, the voltage load on it will decrease until the time b when the speed of the starter motor is such to cause the starter gears to engage. At this point the voltage $V_b$ will stabilize as the associated internal combustion engine is being cranked. At the point in time c, the operator discontinues operation of the starting motor either due to the starting of the engine or the inability of the engine to start.

It will be seen that during successive starting intervals when the engine is not in fact started that the voltage $V_a$ will fall to a point $V_a$, that is quite low and this indicates that the battery is becoming drained of power and will be insufficient to generate the necessary voltage $V_2$ in order to crank the engine once the starter gear is engaged. When this point occurs and continues for a predetermined relatively short time period, such as three seconds, it is determined that the operator should be warned of the battery being depleted.

Figure 5:
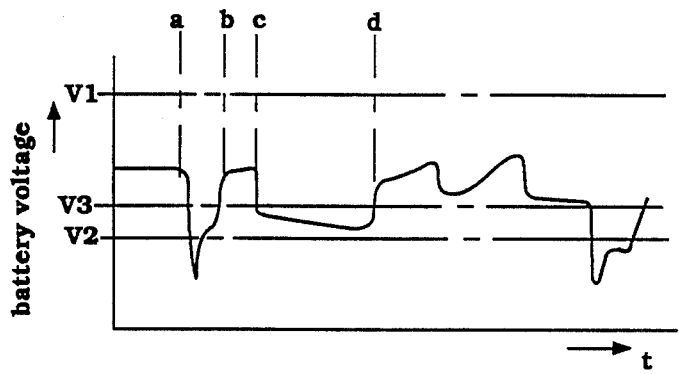
FIG. 5 is a curve showing the battery voltage as it fluctuates during long term operation.

FIG. 5 is a curve of the battery voltage as it occurs during a longer period time of operation. It wil be seen that the battery voltage fluctuates upwardly and downwardly as may occur during normal operation due to the various loads that may be placed on the battery and the charge applied to it. Where, however, the battery voltage falls below a predetermined voltage, which is somewhat higher than the voltage $V_2$, such as the voltage $V_3$, then the battery condition is deteriorated and the operator should be warned if this condition occurs for longer than a predetermined relatively longer time period, such as one minute.

FIG. 3 describes how the system operates and the logic by which the device senses the condition of the battery and provides indication of warning under certain various conditions, as will now be described.

After the program starts, it moves to the step 201 wherein the voltage detector 11 reads the voltage V. The warning judging means 13 then at the step 202 determines if the read voltage V is greater than the predetermined maximum desirable voltage $V_1$. If it is, this is an indication that the battery has been suddenly disconnected and a warning indication will be given at the step 205.

If, however, the voltage V is less than the voltage $V_1$, the program then moves to the step 203 to determine if the read voltage V is less than the voltage $V_2$ which is the voltage necessary to operate the starter motor once the starter gears are engaged. If at the step 203, it is determined that the voltage V is less than the voltage $V_2$ then the frequency count begins at the step 26. If the frequency count N, the number of times when the voltage has been sampled and is less than $V_2$ exceeds the predetermined number of counts equivalent to the three seconds $N_1$, as determined at the step 207, then a warning indication is given at the step 208. If however, the voltage has not been less than the voltage $V_2$ for greater than the number of counts necessary to make up three seconds $N_1$, the program exits and again continues back through a successive reading. Thus, if the voltage stays below the voltage $V_2$ for the three second interval, the warning indication eventually will be given at the step 208.

If, however, the voltage is less than $V_1$ and is either greater than $V_2$ or has been less than $V_2$ for less than the frequency count $N_1$ then the program moves to the step 204 to compare the voltage V with the voltage $V_3$. If the voltage V is less than the voltage $V_3$, the program moves to the step 206 and begins the frequency count again. If the frequency count N as determined in the comparison step 210 is less than the frequency count necessary to indicate that the longer time period, such as one minute, has exceeded $N_2$, then the program moves to the step 211 to give out a warning indication. If, however, the frequency count is less than $N_2$ the program exits and repeats aforenoted.

It should be readily apparent, therefore, that the device operates to provide an indication of the battery condition and a warning signal in response to any of a number of parameters. Also, the device is such that it can be conveniently employed and the operator need not make separate connections to the battery each time the battery is connected or disconnected. It is to be understood, however, that the foregoing description is that of a preferred embodiment of the invention and that various changes and modifications may be made without departing from the spirit and scope of the invention, as defined by the appended claims.

We claim:

1. In a system for determining the condition of a battery in circuit with an internal combustion engine having a starter motor operated by the battery and generating means driven by the engine for maintaining a charge in the battery during the operation of said engine comprising first means for sequentially reading the voltage at first relatively short time periods, second means for sequentially reading the voltage at second relatively long time periods, and warning means for providing a battery condition warning signal in the event the first means senses a voltage below a first value during successive sampling cycles of the relatively short time period or in the event the second means senses a voltage below a second value which is higher than the first value during successive sampling cycles of the relatively long time period.

2. In a system for determining the condition of a battery as set forth in claim 1 further including means for providing a warning signal in the event the voltage exceeds a predetermined high value instantaneously as sensed by third means.

3. In a system for determining the condition of a battery as set forth in claim 1 wherein the first value in the voltage necessary to operate the starter motor.

4. In a system for determining the condition of a battery as set forth in claim 1 wherein the second voltage is a predetermined minimum voltage at which accessories of the engine may be operated.

5. In a system for determining the condition of a battery as set forth in claim 3 wherein the second voltage is a predetermined minimum voltage at which accessories of the engine may be operated.

6. In a system for determining the condition of a battery as set forth in claim 5 further including means for providing a warning signal in the event the voltage exceeds a predetermined high value instantaneously as sensed by third means.

* * * * *